United States Patent [19]

Iida et al.

[11] 4,446,567
[45] May 1, 1984

[54] DYNAMIC SHIFT REGISTER CIRCUIT

[75] Inventors: Tetsuya Iida; Tatsuo Sakaue, both of Yokohama, Japan

[73] Assignee: Tokyo Shibaura Denki Kabushiki Kaisha, Kawasaki, Japan

[21] Appl. No.: 237,959

[22] Filed: Feb. 25, 1981

[30] Foreign Application Priority Data

Mar. 5, 1980 [JP] Japan .................................. 55-27647

[51] Int. Cl.³ ...................... G11C 19/28; H03K 23/22
[52] U.S. Cl. ........................................ 377/79; 377/81; 307/482
[58] Field of Search ............... 307/238.4, 238.5, 238.8, 307/450, 453, 481, 482, 578, 582, 583, 601, 605; 377/64, 69, 78, 79, 81, 104, 105, 75, 68

[56] References Cited

U.S. PATENT DOCUMENTS

| | | | |
|---|---|---|---|
| 3,588,526 | 6/1971 | Cricchi | 377/79 |
| 3,683,203 | 8/1972 | Smith | 307/583 |
| 3,829,711 | 8/1974 | Crowle | 307/583 |
| 3,898,479 | 8/1975 | Proebsting | 377/79 |
| 3,916,169 | 10/1975 | Cochran et al. | 307/450 |
| 4,354,123 | 10/1982 | Eaton, Jr. | 307/482 |

OTHER PUBLICATIONS

Pages 129-132 of Chapter 5, "Shift Registers for Data Delay, Logic, and Memory" of the Book MOS/LSI Design and Application by William N. Car et al.

Primary Examiner—Larry N. Anagnos
Assistant Examiner—David R. Bertelson
Attorney, Agent, or Firm—Finnegan, Henderson, Farabow, Garrett & Dunner

[57] ABSTRACT

A dynamic shift register circuit comprises an input terminal and an output terminal. It further comprises a first transfer gate circuit connected to the input terminal for receiving an input signal and transferring the input signal under the control of a first clock signal; an inverter circuit for inverting a level of an output signal of the first transfer gate circuit; a second transfer gate circuit connected to the inverter circuit for receiving an output signal of the inverter circuit and transferring the same under the control of a second clock signal which has a level opposite to that of the first clock signal; a signal follower circuit for producing an output signal having a level which follows a level of the output signal of the first transfer gate circuit; and a logic circuit connected to first and second power source voltages. The logic circuit is made operative by an output signal of the signal follower circuit and produces an inverter function at the output terminal, in response to an output signal of the second transfer gate circuit. The logic circuit comprises a capacitor element one terminal of which is connected to the output terminal of the signal follower circuit and the other terminal of which is connected to said output terminal of the dynamic shift register.

4 Claims, 10 Drawing Figures

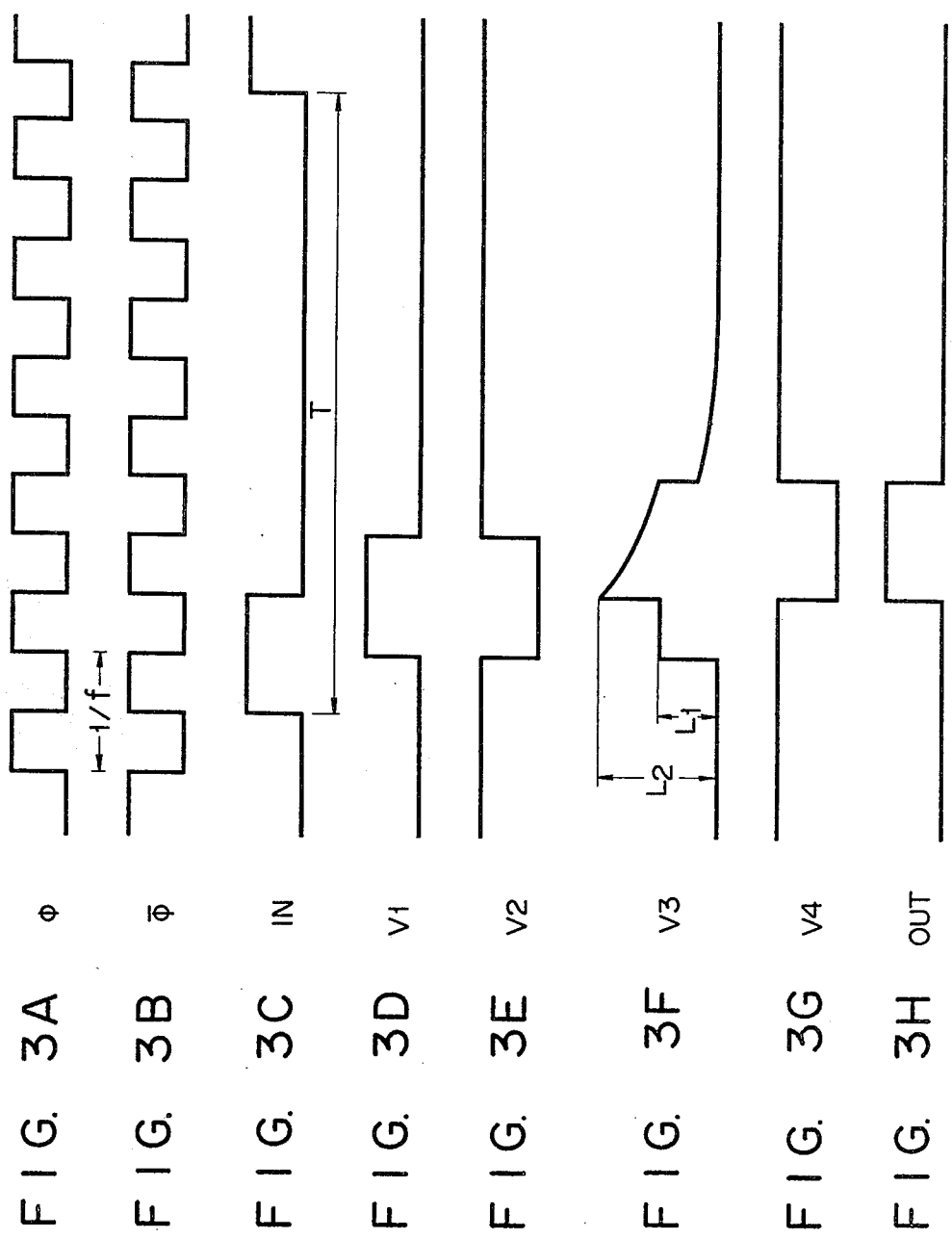

DYNAMIC SHIFT REGISTER CIRCUIT

This invention relates to a dynamic shift register circuit using MOS (metal oxide semiconductor) transistors.

A variety of dynamic shift register circuits are known which dynamically retain input data, utilizing the gate capacitors of MOS transistors. The widely used of these register circuits are a ratioless dynamic shift register and a shift register circuit which comprises a so-called E/D (enhancement/depletion) inverter and a transfer gate circuit cascade-connected to the E/D inverter. The E/D inverter comprises a depletion type MOS transistor which is used as a load transistor and an enhancement type MOS transistor which is used as a driving transistor.

Provided with an E/D inverter, the shift register circuit inevitably has a DC current path. The shift register circuit therefore consumes much power. The ratioless dynamic shift register has drawbacks of its own. Its output voltage cannot be raised to the power source voltage, and the register cannot provide an output signal of a sufficient amplitude.

It is an object of this invention to provide a dynamic shift register circuit which consumes very little power and can yet provide an output signal of a sufficient amplitude.

According to this invention a dynamic shift register circuit is provided which comprises an input terminal; an output terminal; first transfer gate means connected to the input terminal for receiving an input signal and transferring the input signal under the control of a first clock signal; inverter means for inverting a level of an output signal of the first transfer gate means; second transfer gate means connected to the inverter means for receiving an output signal of the inverter means and transferring the output signal of the inverter means under the control of a second clock signal which has a level opposite to that of the first clock signal; a signal follower circuit for producing an output signal having a level which follows the level of the output signal of the first transfer gate means; and a logic circuit connected to first and second power source voltages, said logic circuit being made operative by an output signal of the signal follower circuit and producing an inverter function at the output terminal, in response to an output signal of the second transfer gate means.

This invention can be more fully understood from the following detailed description when taken in conjunction with the accompanying drawings, in which:

FIGS. 3A to 3H are time charts illustrating how the circuit of FIG. 2 operates.

Figure 1:
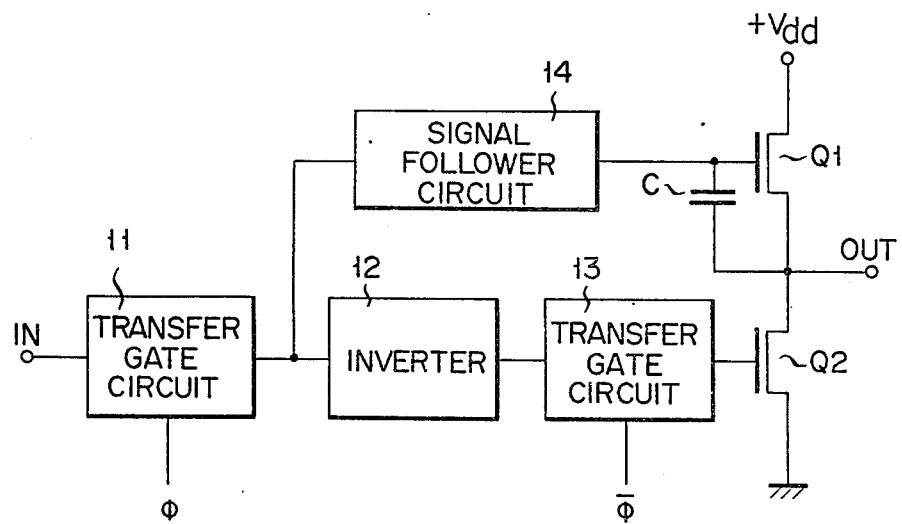
FIG. 1 is a block diagram of an dynamic shift register circuit according to this invention.

FIG. 1 shows an dynamic shift register circuit of this invention in the form of a block diagram. As shown in FIG. 1, the dynamic shift register circuit comprises a transfer gate circuit 11, an inverter 12, another transfer gate circuit 13 and a signal follower circuit 14. The transfer gate circuit 11 is controlled by a clock pulse signal $\phi$ to control an input signal. That is, the circuit 11 controls the reading and writing of the input signal under the control of the control signal $\phi$. An output signal of the transfer gate circuit 11 is supplied to the inverter 12, and its level is inverted by the inverter 12.

An output signal of the inverter 12 is supplied to the transfer gate circuit 13. The circuit 13 is controlled by a control clock pulse signal $\bar{\phi}$ the level of which is opposite to that of the control clock signal $\phi$. Under the control of the control clock signal $\bar{\phi}$ the circuit 13 transfers the output signal of the inverter 12.

The output signal of the transfer gate circuit 11 is supplied also to the signal follower circuit 14. The circuit 14 is so designed as to follow a signal which the transfer gas circuit 11 generates when it is on. That is, the level of the output signal of the circuit 14 changes according to the level of the output signal of the transfer gate circuit 11 when it is on. While the transfer gate circuit 11 is off, the output signal of the circuit 14 is held at a reference potential, i.e. ground potential. The output signal of the circuit 14 is supplied to the gate of an enhancement type N channel MOS transistor $Q_1$ which is connected to receive voltage $+V_{dd}$ at one end and connected at the other end to an output terminal OUT of the dynamic shift register circuit.

The output signal of the transfer gate circuit 13 is supplied to the gate of an enhancement type N channel MOS transistor $Q_2$ which is connected to ground potential at one end and connected at the other end to the output terminal OUT.

Between the gate and source (i.e. terminal OUT) of the transistor $Q_1$ a capacitor C is connected. The capacitor C may be omitted since a parasitic capacitor exists between the gate and source of the transistor $Q_1$. But it is preferred that the capacitor C be provided in order to raise the potential at the terminal OUT unfailingly to the power source voltage $V_{dd}$.

Now it will be described how the dynamic shift register circuit operates.

Suppose the input impedance of the MOS transistor $Q_2$ is high and the output signal of the transfer gate circuit 13 is thus dynamically held at a high level. When a high level input signal is written into the transfer gate circuit 11 while the level of the control clock signal $\phi$ remains high, as high as, for example, the power source voltage $+V_{dd}$, the output signal of the signal follower circuit 14 comes to have a high level. At this moment the control clock signal $\bar{\phi}$ has a low level, and the transfer gate circuit 13 remains off. Nonetheless, the output signal level of the circuit 13 is maintained high. The transistor $Q_2$ is therefore on. As a result, the output signal at the output terminal OUT has a low level, i.e. ground potential (hereinafter called "ground level"). Under this condition the capacitor C is held at voltage $V_x$, a difference between the power source voltage $V_{dd}$ and the sum of the voltage drops at the circuits 11 and 14.

When a low level output signal of the inverter 12 is written into the transfer gate circuit 13 while the level of the control clock signal $\bar{\phi}$ remains high, the transistor $Q_2$ is turned off. As a result, the output signal obtained at the output terminal OUT comes to have a high level. Then, the level of the output signal of the signal follower circuit 14 rises substantially to the sum of voltage $V_x$ and voltage $V_{dd}$. That is, the output signal obtained at the terminal OUT comes to have a level equal to the power source voltage $V_{dd}$.

Figure 2:
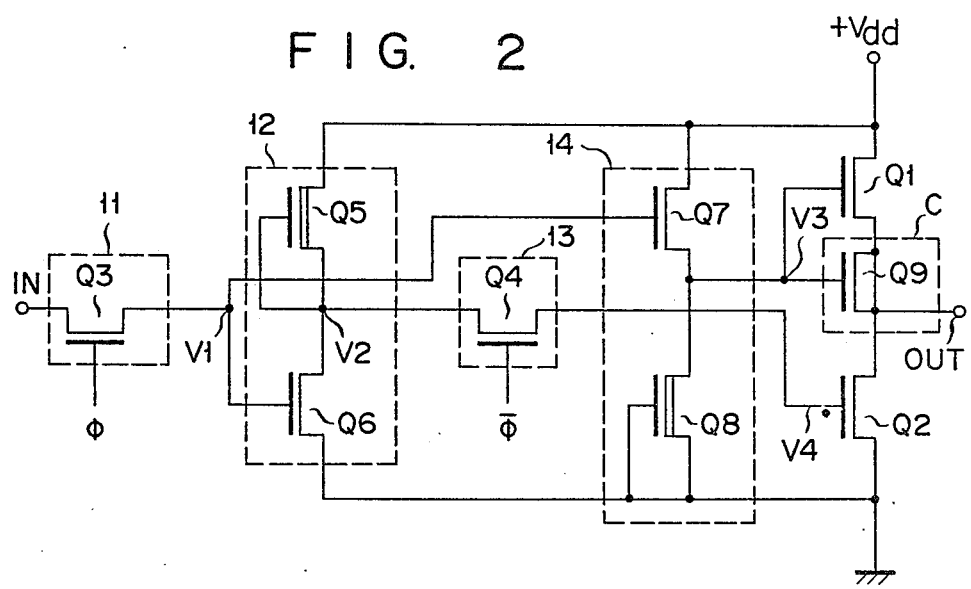
FIG. 2 is a circuit diagram of the dynamic shift register circuit shown in FIG. 1.

FIG. 2 illustrates the structure of the dynamic shift register circuit more in detail. In FIG. 2, the same numerals are used to designate the same blocks as shown in FIG. 1.

As shown in FIG. 2, the dynamic shift register circuit comprises 9 N channel MOS transistors $Q_1$ to $Q_9$. Of these transistors, the transistors $Q_1$, $Q_2$, $Q_3$, $Q_4$, $Q_6$, $Q_7$ and $Q_9$ are of enhancement type. The other transistors $Q_5$ and $Q_8$ are of depletion type.

The transistor $Q_3$ constitutes the transfer gate circuit 11. Its drain is connected to the input terminal IN of the shift register circuit. Its gate is connected to receive a control clock signal $\phi$.

The transistors $Q_5$ and $Q_6$ constitute the inverter 12. The drain of the transistor $Q_5$ is connected to voltage $+V_{dd}$ and the source thereof is connected to the drain of the transistor $Q_6$. The source of the transistor $Q_6$ is connected to a reference potential, i.e. ground level, and the gate thereof is connected to the source of the transistor $Q_3$. The gate and source of the transistor $Q_5$ are connected to each other.

The transistors $Q_7$ and $Q_8$ constitute the signal follower circuit 14 of source follower type. The drain of the transistor $Q_7$ is connected to voltage $+V_{dd}$ and the source thereof is connected to the drain of the transistor $Q_8$. The source and gate of the transistor $Q_8$ are connected to each other. The gate of the transistor $Q_7$ is connected to the source of the transistor $Q_3$.

The transistor $Q_4$ constitutes the transfer gate circuit 13. Its drain is connected to the source of the transistor $Q_5$ and to the drain of the transistor $Q_6$. Its gate is connected to receive a control clock signal $\overline{\phi}$.

The transistor $Q_9$ constitutes the capacitor C. Its gate is connected to the source of the transistor $Q_7$ and also to the drain of the transistor $Q_8$. The transistor $Q_9$ may be omitted since, as mentioned above, a parasitic capacitor exists between the gate and source of the transistor $Q_1$. It is provided merely in order to raise the potential at the output terminal OUT unfailing to the power source voltage $+V_{dd}$. The drain and source of the transistor $Q_9$ are connected to the output terminal OUT.

The transistor $Q_1$ has its drain connected to voltage $+V_{dd}$ and its source connected to the output terminal OUT. The gate of the transistor $Q_1$ is connected to the source of the transistor $Q_7$ and also to the drain of the transistor $Q_8$.

The transistor $Q_2$ has its drain connected to the output terminal OUT and its source connected to the ground. The gate of the transistor $Q_2$ is connected to the source of the transistor $Q_4$.

Now referring to FIGS. 3A to 3H or time charts, it will be described how the shift register circuit of FIG. 2 operates.

The transistor $Q_3$ or the transfer gate circuit 11 remains on while the control clock signal $\phi$ (FIG. 3A) has a high level. Similarly, the transistor $Q_4$ or the transfer gate circuit 13 remains on as long as the control clock signal $\overline{\phi}$ (FIG. 3B) has a high level. When the transfer gate circuits 11 and 13 are on, they receive an input signal and then transfer the same to the circuit of the next stage.

Suppose the output signal V4 (FIG. 3G) of the transistor $Q_4$ is dynamically held at a high level. Then, when a high level input signal (FIG. 3C) is written into the transistor $Q_3$ while the level of the control clock signal $\phi$ remains high (e.g. as high as voltage $+V_{dd}$), the output of the transistor $Q_3$, i.e. the source thereof, deliver a signal V1 (FIG. 3D) of a high level $V_{dd}-V_{thQ3}$, where $V_{thQ3}$ is the threshold voltage of the transistor $Q_3$. As a result, the transistor $Q_7$ is turned on, whereby the output signal V3 (FIG. 3F) of the signal follower circuit 14 comes to have a high level. The level L1 of this output signal is substantially equal to $V_{dd}-(V_{thQ3}+V_{thQ7})$, where $V_{thQ7}$ is the threshold voltage of the transistor $Q_7$.

As long as the control clock signal $\phi$ has a high level, the control clock signal $\overline{\phi}$ has a low level. Thus, the output signal V4 (FIG. 3G) of the transistor $Q_4$ is dynamically held at a high level. Accordingly, the transistor $Q_2$ remains on and the output signal (FIG. 3H) of the shift register circuit has ground level while the control clock signal $\phi$ has a high level. As a result, the capacitor C is charged to nearly the level L1 (FIG. 3F) which is substantially equal to $V_{dd}-(V_{thQ3}+V_{thQ7})$.

When a low level output signal V2 (FIG. 3E) of the inverter 12 is written into, and read from, the transfer gate circuit 13 while the level of the control clock signal $\overline{\phi}$ remains high, the transistor $Q_2$ is turned off and the output signal at the terminal OUT comes to have a high level. In this case, the output signal V3 (FIG. 3F) of the signal follower circuit 14 is raised substantially to $V_{dd}-(V_{thQ3}+V_{thQ7})+V_{dd}$. That is, the level of the output signal of the shift register circuit surpasses the power source voltage $+V_{dd}$.

When the output level of the transfer gate circuit 11 is low, the transistors $Q_6$, $Q_7$ and $Q_1$ remain off and no DC current path exists in the shift register circuit. This follows that the shift register circuit consumes very little power. More specifically, DC current will flow for an extremely short time and the power consumption will be reduced if the time constant $\tau(=C_{Q9}\cdot R_{Q8})$ is far shorter than the period T of the input signal supplied to the input terminal IN. ($C_{Q9}$ is the capacitance of the transistor $Q_9$, and $R_{Q8}$ is the resistance of the transistor $Q_8$.) For instance, if $\tau$ is about 300 ns when T is 10 $\mu$s and the period of the control clock signal $\phi$ or $\overline{\phi}$ is 100 ns, the time during which DC current flows will be reduced very much.

Voltage V3 (FIG. 3F) or the gate voltage of the transistor $Q_9$ grows lower with time constant $\tau=C_{Q9}\cdot R_{Q8}$. But the level of the output signal (FIG. 3H) at the output terminal OUT will never drop to voltage $V_{dd}$ or less during half the period of clock signal $\phi$ or $\overline{\phi}$ if the time constant $\tau$ is chosen to be greater than $1/f$, where f denotes the frequency of the clock signal $\phi$ or $\overline{\phi}$. For instance, the capacitance $C_{Q9}$ may be 1 pF and the resistance $R_{Q8}$ may be 300 K$\Omega$ so that the time constant $\tau$ is 300 ns, and the frequency f may be 10 MHz so that $1/f$ is 100 ns. Then, $\tau(=300 \text{ ns})>1/f(=100 \text{ ns})$, whereby the output level of the terminal OUT never drops to voltage $V_{dd}$ or less during half the period of clock signal $\phi$ or $\overline{\phi}$.

As mentioned above, the present invention provides a dynamic shift register circuit which can produce an output signal having an amplitude equal to the power source voltage used, consuming relatively very little power.

This invention is not limited to the abovementioned embodiment. For example, the signal follower circuit 14 need not be a source follower circuit. Any other circuit can be used instead if its output signal follows an input signal. In the above-mentioned embodiment the signal follower circuit 14 follows the output signal of the transfer gate circuit 11. Instead, it may be so connected to follow the output signal of the inverter 12. Moreover, in place of N channel MOS transistors, P channel MOS transistors may be used to constitute a dynamic shift register circuit. A dynamic shift register circuit made of P channel MOS transistors operates in the same way and brings forth the same effects as does the above-mentioned embodiment, provided it is supplied with power source voltage of the opposite polarity to voltage $+V_{dd}$, i.e. $-V_{ss}$.

Other variants and modifications are possible within the scope of the present invention.

What we claim is:

1. A dynamic shift register circuit comprising:
   an input terminal;
   an output terminal;
   first transfer gate means connected to the input terminal for receiving an input signal and transferring the input signal under the control of a first clock signal;
   inverter means for inverting the level of an output signal of the first transfer gate means;
   second transfer gate means connected to the inverter means for receiving an output signal of the inverter means and transferring the output signal of the inverter means under the control of a second clock signal which has a level opposite to that of the first clock signal;
   a signal follower circuit for producing an output signal having a level which follows the level of the output signal of the first transfer gate means; and
   a logic circuit connected to first and second power source voltages, comprising capacitive bootstrapping means connected between an output terminal of said signal follower circuit and an output terminal of the logic circuit, said logic circuit being made operative by an output signal of the signal follower circuit and producing an inverter function at the output terminal of the logic circuit, in response to an output signal of the second transfer gate means.

2. A dynamic shift register circuit according to claim 1, wherein said logic circuit comprises a first MOS transistor one terminal of which is connected to the first power source voltage, the other terminal of which is connected to said output terminal of the logic circuit and the gate of which is connected to the output terminal of the signal follower circuit, and a second MOS transistor one terminal of which is connected to the second power source voltage, the other terminal of which is connected to said output terminal of the logic circuit and the gate of which is connected to an output terminal of the second transfer gate means.

3. A dynamic shift register circuit according to claim 1, wherein said signal follower circuit is a source follower circuit.

4. A dynamic shift register circuit according to claim 2, wherein said capacitive bootstrapping means is comprised of a MOS transistor the gate of which is connected to the gate of the first MOS transistor and the output terminal of said signal follower circuit and the drain and source of which are connected to said output terminal of said logic circuit.

* * * * *